United States Patent [19]
Martinez

[11] 4,161,663
[45] Jul. 17, 1979

[54] HIGH VOLTAGE CMOS LEVEL SHIFTER

[75] Inventor: Miguel A. Martinez, Anaheim, Calif.

[73] Assignee: Rockwell International Corporation, El Segundo, Calif.

[21] Appl. No.: 885,248

[22] Filed: Mar. 10, 1978

[51] Int. Cl.² .............. H03K 5/02; H03K 3/353; H03K 17/10; H03K 17/60

[52] U.S. Cl. .............. 307/264; 307/200 B; 307/279; 307/288; 307/DIG. 1

[58] Field of Search ............. 307/279, 288, 289, 291, 307/DIG. 1, DIG. 3, 355, 264, 200 B

[56] References Cited

U.S. PATENT DOCUMENTS

| | | | |
|---|---|---|---|
| 3,550,097 | 12/1970 | Reed | 307/279 X |
| 3,900,746 | 8/1975 | Kraft et al. | 307/DIG. 1 X |
| 3,916,430 | 10/1975 | Heuner et al. | 307/DIG. 1 X |
| 3,942,043 | 3/1976 | Sirocka et al. | 307/DIG. 1 X |
| 4,023,050 | 5/1977 | Fox et al. | 307/DIG. 1 X |
| 4,039,862 | 8/1977 | Dingwall et al. | 307/DIG. 1 X |
| 4,045,691 | 8/1977 | Asano | 307/DIG. 1 X |
| 4,077,031 | 2/1978 | Kitigawa et al. | 307/279 X |
| 4,132,904 | 1/1979 | Harari | 307/279 X |

Primary Examiner—Larry N. Anagnos
Attorney, Agent, or Firm—H. Fredrick Hamann; G. Donald Weber, Jr.; Daniel R. McGlynn

[57] ABSTRACT

A reliable voltage level shifter circuit implemented with complementary metal oxide semiconductor field effect transistor (MOSFET) devices, suitable for high voltage applications. The disclosed circuit is relatively unsusceptible to low voltage transistor breakdown, whereby a wide range output voltage swing is achieved.

5 Claims, 2 Drawing Figures

HIGH VOLTAGE CMOS LEVEL SHIFTER

The invention herein described was made in the course of or under a contract or subcontract thereunder with the Department of the Air Force.

BACKGROUND OF THE INVENTION

1. Field of the Invention

This invention relates to a high voltage level shifter circuit comprised of CMOS transistor devices.

2. Statement of the Prior Art

Conventional CMOS voltage level shifter circuits are relatively unreliable for high voltage applications. As a result of the prior art level shifter circuit implementation and deficiencies in device processing, the diode junction of certain CMOS transistor devices (e.g. n-channel FETs) become back biased so as to consequently cause transistor breakdown and failure when relatively low input voltages, typically in the order of 15 volts, are exceeded. Hence, due to the high susceptibility for breakdown of the component transistor devices, the output voltage swing of the prior art level shifter circuits is undesirably limited.

Examples of conventional voltage level shifter circuits are disclosed in the following U.S. Patents:
U.S. Pat No. 3,942,043—Mar. 2, 1976
U.S. Pat. No. 4,039,862—Aug. 2, 1977
However, none of the prior art level shifter patents shows a circuit comprising first and second p-channel field effect transistors interconnected with first and second pairs of series connected n-channel field effect transistors, as disclosed and claimed in the instant patent application, to prevent low voltage transistor breakdown and to thereby extend the range of the level shifter output voltage swing.

SUMMARY OF THE INVENTION

Briefly, and in general terms, a reliable CMOS voltage level shifter is disclosed that is suitable for high voltage applications. The present level shifter is comprised of first and second p-channel FETs and first and second pairs of series connected n-channel FETs. First conduction path electrodes of each of the p-channel FETs are respectively connected to first and second level shifter input terminals. The gate electrodes of each of the p-channel FETs are connected together at a first source of supply voltage. Second conduction path electrodes of each of the p-channel FETs are respectively connected to first and second level shifter output terminals. The first and second pairs of series connected n-channel FETs are connected between a second source of supply voltage and a respective one of the first and second level shifter output terminals. The gate electrodes of the first pair of series connected n-channel FETs are connected together and to the second level shifter output terminal. The gate electrodes of the second pair of series connected n-channel FETs are connected together and to the first level shifter output terminal. The present voltage level shifter is relatively unsusceptible to low voltage transistor breakdown, and, therefore, an extended, wide output voltage swing can be achieved.

DESCRIPTION OF THE PREFERRED EMBODIMENT

Figure 1:
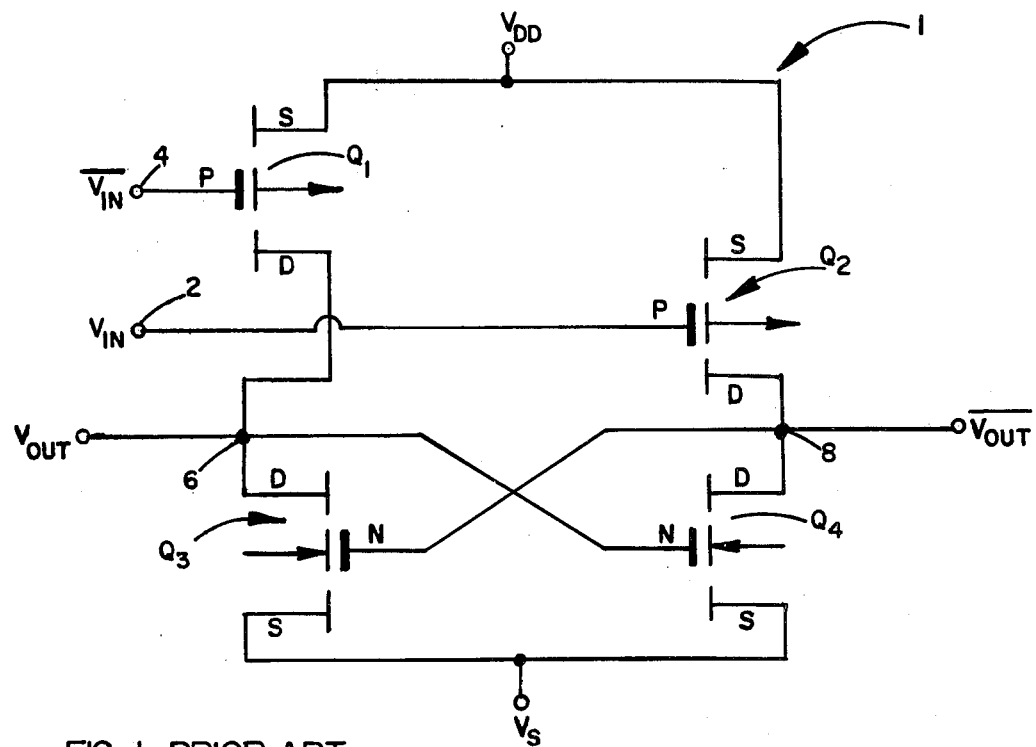
FIG. 1 is a schematic circuit of a prior art CMOS voltage level shifter.

FIG. 1 illustrates one example of the schematic circuit for a prior art CMOS voltage level shifter 1. The prior art voltage level shifter 1 includes first and second input terminals 2 and 4. Input terminal 2 is adapted to receive a first input signal, designated $V_{in}$. Input terminal 4 is adapted to receive a second input signal, designated $\overline{V_{in}}$, the signal level of which is inverted with respect to that of the first input signal $V_{in}$. The conduction path of a first p-channel field effect transistor (FET) $Q_1$ is connected between a source of relatively positive supply voltage, designated $V_{DD}$, and an electrical junction 6. The second level shifter input terminal 4 is connected to the control or gate electrode of FET $Q_1$. The conduction path of a second p-channel field effect transistor (FET) $Q_2$ is connected between the source of supply voltage $V_{DD}$ and an electrical junction 8. The first level shifter input terminal 2 is connected to the gate electrode of FET $Q_2$. The electrical junctions 6 and 8 provide first and second level shifter output signals, designated $V_{out}$ and $\overline{V_{out}}$, respectively. The conduction path of a first n-channel FET $Q_3$ is connected between the electrical junction 6 and a source of relatively negative supply voltage, designated $V_S$. The conduction path of a second n-channel FET $Q_4$ is connected between the electrical junction 8 and the source of supply voltage $V_S$. The gate electrodes of FETs $Q_3$ and $Q_4$ are cross-connected relative to one another. That is, the gate electrode of FET $Q_3$ is connected to the electrical junction 8, and the gate electrode of FET $Q_4$ is connected to the electrical junction 6.

The operation of the prior art voltage level shifter is briefly described as follows. By way of example, when an input voltage signal $\overline{V_{in}}$ having a relatively high signal level (e.g. $V_{DD}$) is applied to the second input terminal 4, FET $Q_1$ is cutoff, due to the lack of sufficient threshold voltage applied to the gate-to-source junction thereof. FET $Q_1$ is, thereby, rendered non-conductive. Inasmuch as the input voltage signal $V_{in}$ that is applied to the first input terminal 2 has a relatively low signal level (e.g. ground), sufficient threshold voltage is applied to the gate-to-source junction of FET $Q_2$, and FET $Q_2$ is, thereby, rendered conductive. As a result, the electrical junction 8 is driven towards the signal level of the source of positive supply voltage $V_{DD}$ via the conduction path of FET $Q_2$. As the voltage of the electrical junction 8 approximates the $V_{DD}$ voltage level, FET $Q_3$ is rendered conductive, inasmuch as the gate electrode thereof is connected to the electrical junction 8. The electrical junction 6 is, thereby, driven towards the source of negative supply voltage $V_S$ via the conduction path of FET $Q_3$. As the voltage at the electrical junction 6 approximates that of the source of supply voltage $V_S$, FET $Q_4$ is rendered non-conductive, inasmuch as the gate electrode thereof is connected to the electrical junction 6. Therefore, the level shifter output signal $\overline{V_{out}}$ that is applied to the electrical junction 6 achieves the full $V_S$ voltage level via conduction path of FET $Q_3$. The level shifter output signal $V_{out}$ that is applied to the electrical junction 8 achieves the full $V_{DD}$ voltage level via the conduction path of FET $Q_2$.

As a consequence of the circuit configuration for the prior art voltage level shifter 1 of FIG. 1, each of two field effect transistors absorbs the full output voltage swing (i.e. from $V_S$ to $V_{DD}$). More particularly, in the example described above, each of the FETs $Q_1$ and $Q_4$ absorbs the full output voltage swing across the respective source-to-drain conduction path thereof. Thus, relatively low input voltage signals (typically in the order of 15 volts) are known to cause drain breakdowns in certain field effect transistor devices (e.g. n-channel FETs $Q_3$ and $Q_4$) which comprise the prior art voltage level shifters. As a result of the high susceptibility to breakdown, the range of the output voltage swing that can be achieved by utilization of the prior art voltage level shifters is undesirably limited.

Figure 2:
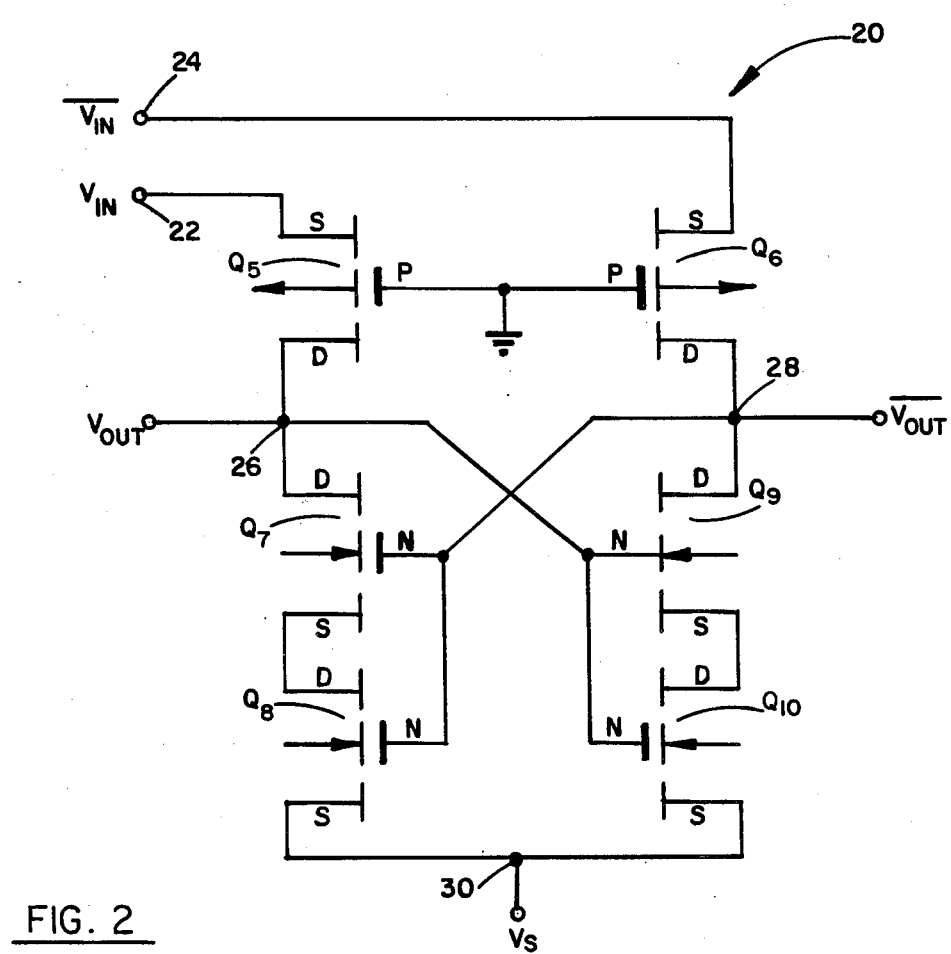
FIG. 2 is a schematic circuit of the presently disclosed high voltage CMOS level shifter.

In accordance with the present invention, FIG. 2 illustrates the schematic circuit for an improved high voltage CMOS level shifter 20. The improved CMOS level shifter 20 includes first and second input terminals 22 and 24. Input terminal 22 is adapted to receive a first input signal, designated $V_{in}$. Input terminal 24 is adapted to receive a second input signal, designated $\overline{V_{in}}$, the signal level of which is inverted with respect to that of the first input signal $V_{in}$. The conduction path of a first p-channel field effect transistor (FET) $Q_5$ is connected between the first level shifter input terminal 22 and an electrical junction 26. The conduction path of a second p-channel field effect transistor (FET) is connected between the second level shifter input terminal 24 and an electrical junction 28. The control or gate electrodes of FETs $Q_5$ and $Q_6$ are connected together and to a source of relatively positive supply voltage, such as ground. The electrical junctions 26 and 28 provide first and second level shifter output signals, designated $V_{out}$ and $\overline{V_{out}}$, respectively. The conduction paths of a first pair of n-channel FETs $Q_7$ and $Q_8$ are connected in electrical series between the electrical junction 26 and an electrical junction 30. The electrical junction 30 is connected to a source of relatively negative supply voltage (typically −15 volts d.c.), designated $V_S$. The conduction paths of a second pair of n-channel FETs $Q_9$ and $Q_{10}$ are connected in electrical series between the electrical junctions 28 and 30. The control or gate electrodes of FETs $Q_7$ and $Q_8$ and FETs $Q_9$ and $Q_{10}$ are cross-connected relative to one another. That is, the gate electrodes of each of the FETs $Q_7$ and $Q_8$ are connected together and to the electrical junction 28. The gate electrodes of each of the FETs $Q_9$ and $Q_{10}$ are connected together and to the electrical junction 26.

The operation of the presently disclosed CMOS voltage level shifter 20 is described as follows. When an input voltage signal $V_{in}$ having a relatively low signal level (e.g. ground) is applied to the first input terminal 22, p-channel FET $Q_5$ is cutoff, due to the lack of sufficient threshold voltage applied to the gate-to-source junction thereof. FET $Q_5$ is, thereby, rendered non-conductive. Inasmuch as the input voltage signal $\overline{V_{in}}$ that is applied to the second input terminal 24 has a relatively high signal level, such as $V_{DD}$ (typically +6 volts d.c.), sufficient threshold voltage is applied to the gate-to-source junction of p-channel FET $Q_6$, and FET $Q_6$ is thereby rendered conductive. As a result, the electrical junction 28 is driven towards the $V_{DD}$ level of the $\overline{V_{in}}$ input voltage signal via the conduction path of FET $Q_6$. As the voltage of the electrical junction 28 approximates the $V_{DD}$ voltage level, each of the p-channel FETs $Q_7$ and $Q_8$ are rendered conductive, inasmuch as the gate electrodes thereof are connected together to receive the positive voltage of electrical junction 28. The electrical junction 26, is, thereby, driven towards the source of supply voltage $V_S$ via the series connected conduction paths of FETs $Q_7$ and $Q_8$. As the voltage at the electrical junction 26 approximates that of the source of supply voltage $V_S$, the n-channel FETs $Q_9$ and $Q_{10}$ are rendered non-conductive, inasmuch as the gate electrodes of the FETs $Q_9$ and $Q_{10}$ are connected together to receive the negative voltage of the electrical junction 26. Therefore, the level shifter output signal $\overline{V_{out}}$ that is applied to the electrical junction 28 achieves the full $V_{DD}$ voltage level via the conduction path of FET $Q_6$. Moreover, the level shifter output signal $V_{out}$ that is applied to the electrical junction 26 achieves the full voltage level of the source of supply voltage $V_S$ via the conduction paths of FETs $Q_7$ and $Q_8$.

Should the input voltage signals $V_{in}$ and $\overline{V_{in}}$ that are applied to the level shifter input terminals 22 and 24 otherwise have relatively high and low signal levels, respectively, the operation of the present voltage level shifter 20 is similar to that described above. However, the level shifter output signal $\overline{V_{out}}$ that is applied to the electrical junction 28 achieves the full $V_S$ supply voltage via the conduction paths of FETs $Q_9$ and $Q_{10}$. Moreover, the level shifter output signal $V_{out}$ that is applied to the electrical junction 26 achieves the full $V_{DD}$ voltage level via the conduction path of FET $Q_5$.

Thus, by virtue of the presently disclosed voltage level shifter 20, the input voltage signals $V_{in}$ and $\overline{V_{in}}$, which have a voltage swing of approximately 6 volts between ground and $V_{DD}$, are level shifted to output voltage signals $V_{out}$ and $\overline{V_{out}}$, which accordingly have a corresponding voltage swing of approximately 21 volts between $V_S$ and $V_{DD}$. As an advantageous result of the circuit configuration of the presently disclosed CMOS voltage level shifter 20, no single field effect transistor absorbs the full output voltage swing (i.e. from $V_S$ to $V_{DD}$) across the respective conduction path thereof. Hence, unlike the prior art level shifters, such as that illustrated in FIG. 1, the presently disclosed level shifter 20 is both reliable and relatively unsusceptible to low voltage transistor breakdown. What is more, the wide range output voltage swing of the present level detector is maximized. Thus, the presently disclosed level shifter 20 is suitable for high voltage applications (e.g. typically in the order of 25–30 volts).

It will be apprent that while a preferred embodiment of the invention has been shown and described, various modifications and changes may be made without departing from the true spirit and scope of the invention.

Having thus set forth a preferred embodiment of the present invention, what is claimed is:

1. A voltage level shifter comprising:
   first and second sources of supply voltage,
   first and second transistor devices having respective conduction paths and control electrodes,
   first and second pairs of series connected transistor devices having respective conduction paths and control electrodes,
   first and second input terminals to receive respective input voltage signals, and
   first and second output terminals to provide output voltage signals having a wide output voltage swing,
   said first transistor device connected between said first input terminal and said first output terminal,
   said second transistor device connected between said second input terminal and said second output terminal,
   the respective control electrodes of said first and second transistor devices connected together and to said first source of supply voltage, said first pair of series connected transistor devices connected between said first output terminal and said second source of supply voltage, said second pair of series connected transistor devices connected between said second output terminal and said second source of supply voltage, the respective control electrodes of each of the first pair of transistor devices connected together and to said second output terminal, the respective control electrodes of each of the second pair of transistor devices connected together and to said first output terminal.

2. The voltage level shifter recited in claim 1, wherein each of said first and second transistor devices is of a first conductivity type and each of said first and second pairs of series connected transistor devices is of a second conductivity type.

3. The voltage level shifter recited in claim 2, wherein each of said first and second transistor devices and each of said first and second pairs of series connected transistor devices is a field effect transistor.

4. The voltage level shifter recited in claim 1, wherein each of said first and second transistor devices is a p-channel field effect transistor, and each of said first and second pairs of series connected transistor devices is an n-channel field effect transistor.

5. The voltage level shifter recited in claim 1, wherein said first source of supply voltage is positive relative to said second source of supply voltage.

* * * * *